United States Patent
Chen et al.

(10) Patent No.: US 6,242,322 B1
(45) Date of Patent: Jun. 5, 2001

(54) METHOD FOR FORMING SHALLOW TRENCH ISOLATION FILLED WITH HIGH-DENSITY PLASMA OXIDE LAYER

(75) Inventors: Hsi-Chieh Chen, Pei; Cheng-Yu Chen, Tainan, both of (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/453,440

(22) Filed: Dec. 3, 1999

(51) Int. Cl.⁷ .................................................. H01L 21/76
(52) U.S. Cl. .......................... 438/424; 438/296; 438/427
(58) Field of Search ............................... 438/296, 424, 438/427, 435, 437

(56) References Cited

U.S. PATENT DOCUMENTS

| | | | |
|---|---|---|---|
| 5,923,993 | * | 7/1999 | Sahota .................................. 438/427 |
| 6,033,970 | * | 3/2000 | Park ...................................... 438/435 |
| 6,048,771 | * | 4/2000 | Lin et al. ............................... 438/296 |
| 6,048,775 | * | 4/2000 | Yao et al. .............................. 438/427 |
| 6,057,210 | * | 5/2000 | Yang et al. ............................ 438/427 |
| 6,071,792 | * | 6/2000 | Kim et al. .............................. 438/424 |
| 6,159,822 | * | 12/2000 | Yang et al. ............................ 438/427 |
| 6,171,929 | * | 1/2001 | Yang et al. ............................ 438/427 |

* cited by examiner

*Primary Examiner*—Charles Bowers
*Assistant Examiner*—David S Blum
(74) *Attorney, Agent, or Firm*—Rosenberg, Klein & Lee

(57) ABSTRACT

The present invention proposes a method for forming shallow trench isolation. Isolation trenches are firstly formed on a silicon substrate. High-density plasma oxide layer is used to fill the trenches. A layer of poly-silicon and a thin oxide layer are then deposited on the high-density plasma oxide layer. Selective poly-silicon chemical mechanical polishing is then used to form a self-align reverse poly mask on the surface of the shallow trenches filled with the high-density plasma oxide layer. The high-density plasma oxide layer is locally etched. Chemical mechanical polishing is then used to perform a planarization process on the surface. In the present invention, photolithography is not necessary in the planarization process of high-density plasma oxide layer. Manufacture cost is thus lower.

3 Claims, 4 Drawing Sheets

METHOD FOR FORMING SHALLOW TRENCH ISOLATION FILLED WITH HIGH-DENSITY PLASMA OXIDE LAYER

FIELD OF THE INVENTION

The present invention relates to a method for isolating shallow trench and, more particularly, to a method of using high-density plasma oxide layer to fill shallow trench.

BACKGROUND OF THE INVENTION

Along with trend of integrated circuit devices toward high-density integration, required accuracy of manufacturing process becomes higher and higher. Because of smaller distances between components, isolation between components becomes more important. The shallow trench isolation (STI) technology has been developed to fulfill this isolation requirement of components. Methods for filling the trench include chemical vapor deposition (CVD) and plasma-enhanced chemical vapor deposition (PECVD). An oxide layer is formed directly on the trench, and then a planarization process such as resist etch back (REB), reactive ion etch (RIE), or chemical mechanical polishing (CMP) is used to acquire a more planar chip surface. Although the above mentioned methods for filling the trench can successfully fill the trench, voids may easily arise from incomplete filling. To overcome this problem, high-density plasma chemical vapor deposition (HDP-CVD) method has been developed to generate high-density plasma oxide layer for filling the trench. The HDP-CVD method has advantages such as that gap does not easily arise, and that the oxide layer has low wet chemical etch rate, better moisture-resistance, and better stability.

In prior art, there exist many planarization processes of the shallow trench isolation. The most efficient one is that using reverse mask and pre-etch at active regions to let chemical mechanical polishing be better controlled. For instance, U.S. Pat. No. 5,851,899 discloses a gapfill and planarization process for shallow trench isolation. However, photolithography is needed in this process, resulting in higher cost.

To reduce cost, photolithography must be avoided. Another technology using poly-silicon cap and chemical mechanical polishing to form a self-align reverse mask is thus proposed. This technology can be successfully applied to process of using tetra-ethyl-ortho-silicate (TEOS) to fill the shallow trench, but can not be applied to process of using high-density plasma to fill shallow trench isolation. This is because that when the poly-silicon cap is polished using chemical mechanical polishing, dishing effect arises so as to let high-density plasma oxide layer be exposed out of the self-align reverse mask.

SUMMARY OF THE INVENTION

Accordingly, the primary object of the present invention is to propose a method of applying poly-silicon cap and chemical mechanical polishing to form a self-align reverse mask for filling shallow trench isolation using high-density plasma oxide layer.

According to the present invention, a method for forming shallow trench isolation comprises the steps of: using high-density plasma oxide layer to fill the shallow trench; depositing a layer of poly-silicon cap and a thin oxide layer thereon; using selective poly-silicon chemical mechanical polishing to form a self-align reverse mask at the surface of the shallow trench filled with the high-density plasma oxide layer; locally etching the high-density plasma oxide layer; and using chemical mechanical polishing to perform a planarization process.

This and other objects, features and advantages of the present invention will become apparent to those skilled in the art upon consideration of the following description of the preferred embodiments of the present invention taken in conjunction with the accompanying drawings.

DETAILED DESCRIPTION OF THE PREFERRED EMBODIMENTS

Figure 1A:
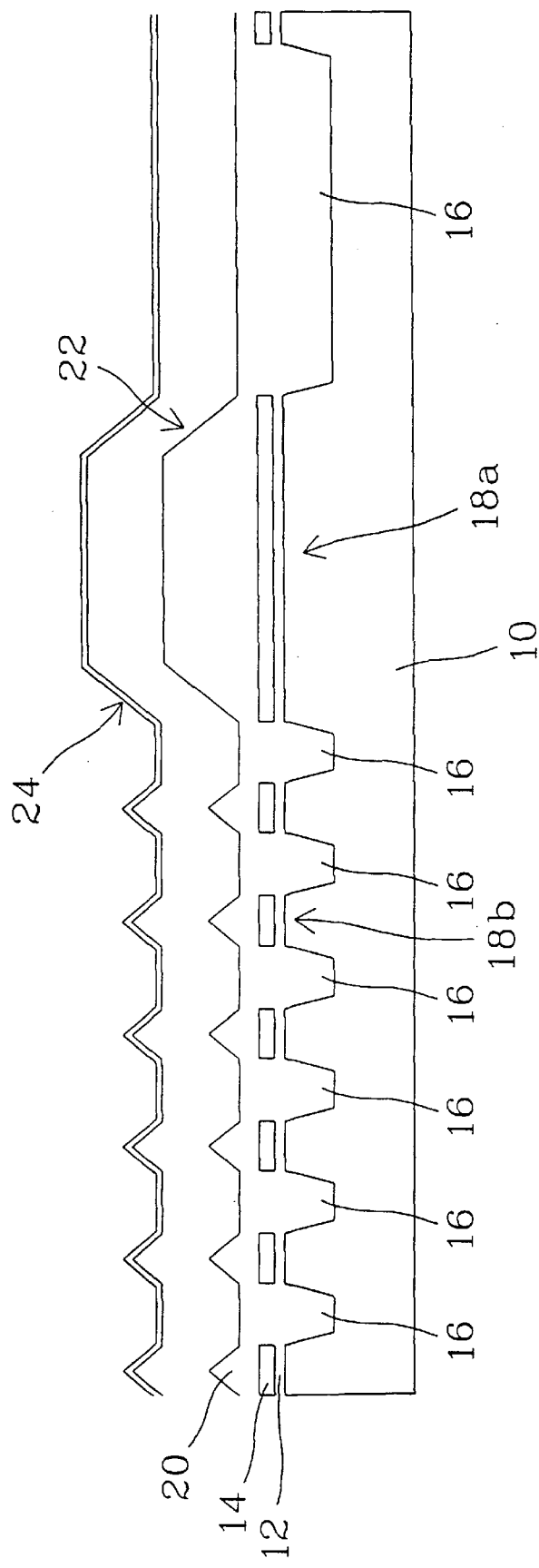
FIGS. 1A–1D is a cross-sectional view showing the planarization process of how to use high-density plasma oxide layer to fill the shallow trench according to a preferred embodiment of the present invention.

As shown in FIG. 1, isolation trenches are firstly formed on a silicon substrate 10. As shown in FIG. 1(a), this can be accomplished by the method in prior art comprising the steps of: using thermal oxidation or other means to form pad oxides 12; using chemical vapor deposition or other means to deposit a layer of silicon nitride 14; using photolithography and etch process to let part of the surface of the silicon substrate 10 thereunder be exposed; using plasma etch or other means to form trenches 16; using high-density plasma chemical vapor deposition to deposit a high-density plasma oxide layer 20 for filling the trenches 16 wherein a thicker high-density plasma oxide layer forms on an active region of larger area 18a, a thinner high-density plasma oxide layer forms on an active region of smaller area 18b, and a slope forms at the edge of the high-density plasma oxide layer above the active regions 18a and 18b; using chemical vapor deposition or other means to deposit a poly-silicon cap 22; and using chemical vapor deposition or other means to deposit a thin oxide layer 24.

Figure 1B:
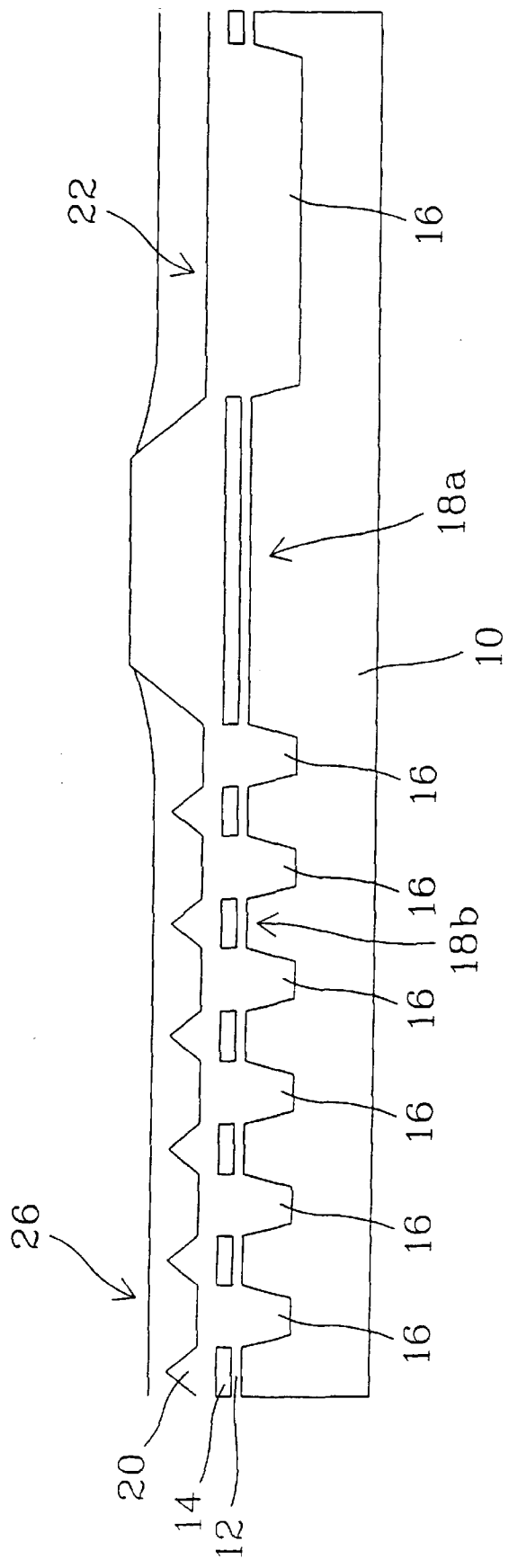
Figure 1C:
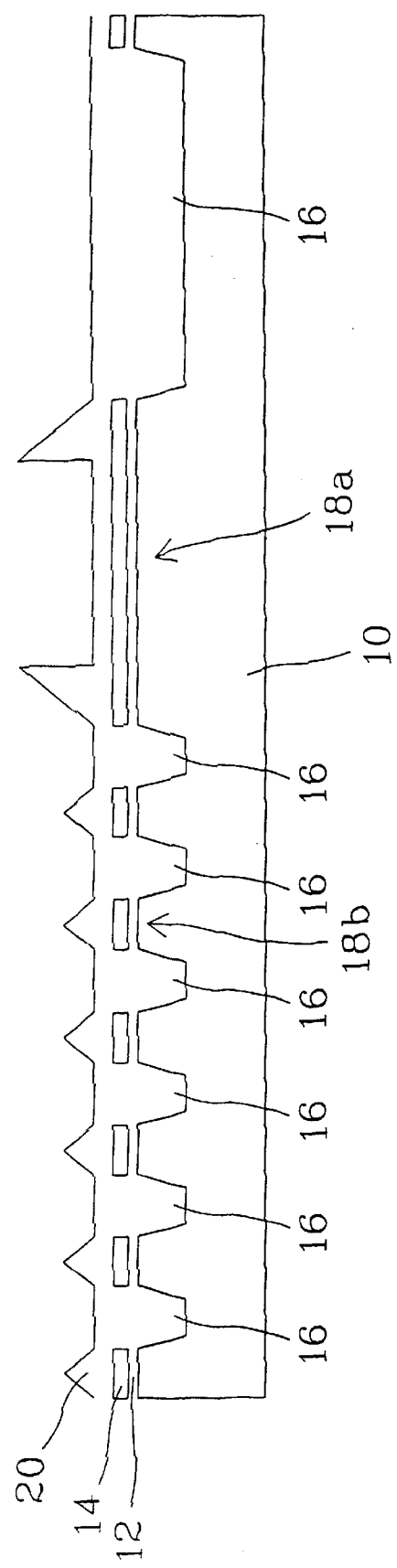
Figure 1D:
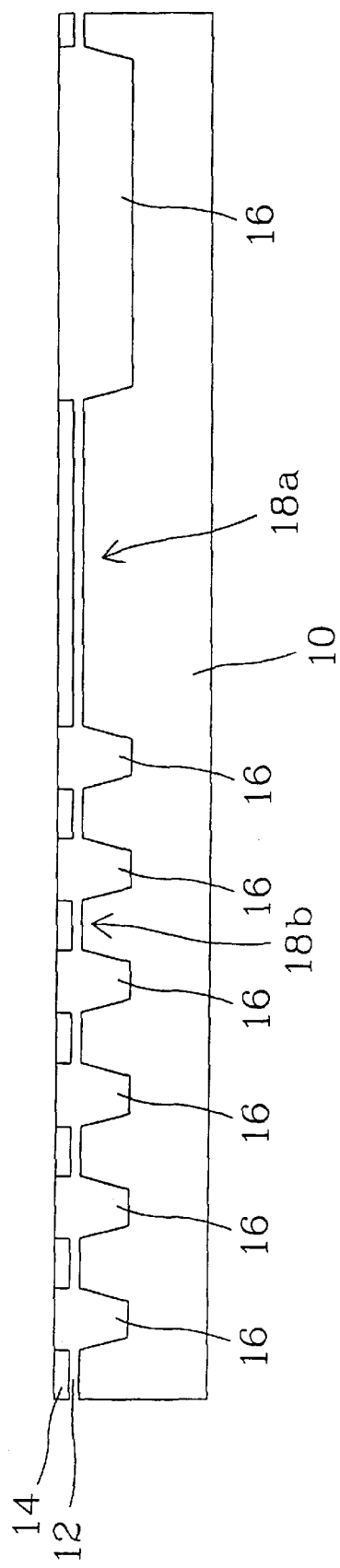

Selective poly-silicon chemical mechanical polishing is then used to perform the polishing process. Because of reverse-dishing effect, a self-align reverse poly mask 26 is formed on the surface of the shallow trench filled with high-density plasma oxide layer, as shown in FIG. 1(b). The high-density plasma oxide layer 20 on the active region 18a is locally etched and the poly-silicon cap 22 is removed, as shown in FIG. 1(c). Chemical mechanical polishing is then used to perform a planarization process on the surface, as shown in FIG. 1(d). Subsequent processes are the same as those in prior art and will not be further described.

In the present invention, etch selectivity of the poly-silicon to oxide layer can be adjusted. The adjustment range is from 30:1 to 300:1. Generally, selectivity of chemical polishing liquid of poly-silicon chemical mechanical polishing is very high. When the selectivity exceeds 5:1, reverse-dishing effect arises. The higher the selectivity, the more conspicuous the reverse-dishing effect. Self-align reverse poly mask forms because of the reverse-dishing effect, thus photolithography is not necessary in subsequent planarization process of high-density plasma oxide layer. Local etch and chemical mechanical polishing can be directly used to perform a planarization process on the surface. Therefore, manufacture cost is lower. That is, the present invention does not require an additional photolithography process, and can apply self-align reverse poly mask to the manufacturing process of the shallow trench isolation filled with high-density plasma oxide layer.

While the present invention has been described in conjunction with preferred embodiments thereof, it is evident that many alternatives, modifications, and variations will be apparent to those skilled in the art. Accordingly, it is intended to embrace all such alternatives, modifications, and variations that fall within the spirit and scope thereof as set forth in the appended claims.

What is claimed is:

1. A method for forming shallow trench isolation comprising the steps of:

provide a silicon substrate with trenches formed thereon;

using high-density plasma chemical vapor deposition to generate high-density plasma oxide layer for filling said trenches;

using chemical vapor deposition to deposit a layer of poly-silicon cap and a thin oxide layer on the poly-silicon cap;

using selective poly-silicon chemical mechanical polishing to remove said thin oxide layer and part of said poly-silicon cap;

locally etching said high-density plasma oxide layer; and using chemical mechanical polishing to perform a planarization process.

2. The method for forming shallow trench isolation of claim 1, wherein the range of selectivity of poly-silicon to oxide layer in said selective chemical mechanical polishing is from 30:1 to 300:1.

3. The method for forming shallow trench isolation of claim 1 further comprises the step of removing remaining said poly-silicon cap after the step of locally ething said high-density plasma oxide layer.

* * * * *